United States Patent [19]

Roberts

[11] 4,346,315

[45] Aug. 24, 1982

[54] SWITCHED DELAY LINE FOR STEERABLE NULL ANTENNA SYSTEM

[75] Inventor: Eugene L. Roberts, Maitland, Fla.

[73] Assignee: The United States of America as represented by the Secretary of the Army, Washington, D.C.

[21] Appl. No.: 180,554

[22] Filed: Aug. 25, 1980

[51] Int. Cl.[3] .......................... H03K 5/14; H03K 17/66
[52] U.S. Cl. ...................................... 307/603; 328/56; 333/139; 307/256; 307/242
[58] Field of Search ............... 307/595, 596, 597, 602, 307/603; 328/55, 56; 333/139

[56] References Cited

U.S. PATENT DOCUMENTS

| | | | |
|---|---|---|---|
| 3,295,138 | 12/1966 | Nelson | 307/603 |
| 3,778,733 | 12/1973 | Rizzi | 333/139 |
| 3,982,214 | 9/1976 | Burns | 328/56 |
| 4,054,804 | 10/1977 | Tanaka | 307/603 |

Primary Examiner—John S. Heyman
Attorney, Agent, or Firm—Nathan Edelberg; Jeremiah G. Murray; Edward Goldberg

[57] ABSTRACT

The delay line has a number of sections in tandem. Each section comprises two line segments in parallel, one of which is relatively short and the other of a length to provide a given differential delay for the section. Each segment has a PIN diode at each end, poled in one direction for the short segment and in the other direction for the other. The bias arrangement for the PIN diodes includes four transistor switches in a bridge, with a selected pair in opposite legs turned on to cause a polarity which permits it to flow through only that segment in which the PIN diodes are forward biased. The given differential delay for the several sections has a binary relation.

4 Claims, 4 Drawing Figures

SWITCHED DELAY LINE FOR STEERABLE NULL ANTENNA SYSTEM

The invention described herein may be manufactured and used by or for the Government for governmental purposes without the payment of any royalties thereon or therefor.

BACKGROUND OF THE INVENTION

This invention relates to a solid state switching arrangement for a steerable null antenna system; and more particularly to an arrangement to provide an incrementally variable delay unit by switching of delay line segments in the path between a plurality of antenna elements and the radio equipment.

The following references numbered 1 to 28 in the time delay null technology area are of interest, and are hereby incorporated by reference. Within the references are shown cascaded binary delay line representations with analysis.

1. Teeter, W. L., and K. R. Bushore, "A Variable Ratio Microwave Power Divider and Multiplexer", IRE Trans, Vol. MTT-5; October 1957, pp. 227–229.
2. Vaillancourt, R. M., "Analysis of the Variable Ratio Microwave Divider", IRE Trans, Vol. MTT-6, April 1958, pp. 238–239.
3. Vaillancourt, R. M., "Optical Hybrid Junction for Millimeter Wavelength", IRE Canadian Convention Records, 1958, pp. 367–374.
4. Mohr, R. J., "Some Design Aspects of Components Utilizing Symetric 3-dB Hybrids", Microwave Journal, June 1962, pp. 90–94.
5. Graham, J. W., "Transmission Properties of Lossless Reciprocal Matched Four-Ports with Directivity", ANZAC Electronics Tech. Memorandum No. 1, March 1968.
6. Mason, S. J., "Feedback Theory—Some Properties of Signal Flow Graphs", Proc. IRE, Vol. 41, September 1953, pp. 1144–1156.
7. Garver, R. V., "Broadband Diode Phase Shifters". IEEE Trans, Vol. MTT-20, No. 5, May 1972, pp. 314–323.
8. Reindel, J., "Microwave Integrated Circuits for Phased Arrays". Navel Electronics Laboratory Center, October 1970 (AD87820).
9. Vincent, B. T., Jr., and M. E. Wallance, "Microwave Integrated Circuits for Phased Array Applications", Microwave Journal, September 1969, pp. 53–59.
10. Tang, R., "Phased Array Antenna for Airborne Applications", Microwave Journal, Vol. 14, January 1971, pp. 31–38.
11. Stark, L., "Microwave Components for Wide-Band Phased Arrays", Proc. IEEE, Vol. 56, No. 11, November 1968, pp. 1908–1931.
12. White, J. F., "Review of Semiconductor Microwave Phase Shifters", Proc. IEEE, Vol. 56, No. 11, November 1968, pp. 1924–1931.
13. Kelly, A. J., "Electronically Variable Time-Delay Network for Broadband Phased-Array Steering", Trans. IEEE, Vol. AES-4, No. 6, pp. 837–844.
14. Holden, R. L., "A High Power UHF Microstrip Phase Shifter", Hughes Aircraft Company Ground Systems Group, Fullerton, Calif.
15. White, J. F., "High Power, PIN Diode Controlled, Microwave Transmission Phase Shifters", Trans IEEE, Vol. MTT-13, March 1965, pp. 233–242.
16. Fisher, R. E., "Digital Reflection-Type Microwave Phase Shifters", Microwave Journal, May 1969, pp. 63–68.
17. Garver, R. V., "Theory of TEM Diode Switching", Trans IRE, Vol. MTT-9, May 1961, pp. 224–238.
18. Choi, Soon D., "High Power Microstrip RF Switchers", Jet Propulsion Laboratory, Pasadena, Calif.
19. Lepoff, Jack, "PIN Power Calculations Simplified", Microwave Journal, July 1972, pp. 38–41.
20. "Application of PIN Diodes", Hewlett Packard Application Note 922.
21. Lepoff, Jack, "A New PIN Diode for UHF-VHF Applications" Hewlett Packard, Palo Alto, Calif., January 1971.
22. "PIN Diode Circuit Design Curves", Microwave Engineers' Handbook, Vol. 2, pp. 174–177, Horizon House Microwave, Inc., 1971.
23. Kadar, N., "Voltage Controlled RF Attenuator", Electronic Design, Vol. 15, July 1971, pp. 66–67.
24. Siegal, B., "The Binary Varactor—A New Microwave Device", Microwave Journal, May 1970.
25. Parris, W. J., "PIN Variable Attenuator with Low Phase Shift" Trans IEEE, Vol. MTT, September 1972, pp. 618–619.
26. "An Attenuator Design Using PIN Diodes". Hewlett Packard Application Note 912.
27. Young, Leo, "Parallel Coupled Lines and Directional Couplers", compiled reprints of 30 papers covering stripline and microstrip coupled-line theory and applications, Artech House, 1972.
28. "S Parameters, Circuit Analysis and Design", Hewlett Packard Application Note 95 and 154.

Variable length wide bandwidth low loss electronically variable delay lines are useful in processing RF signals. In adaptive antenna arrays or steerable antenna null applications, the variable delay lines permit obtaining either very wide band width nulls or very wideband width main beams when used with an array of antenna elements and signal summing device. The variable delay line can meet bandwidth, loss and calibration requirements by use of cascaded binary related delay sections that may be switched in or out. However, shunt switched lines have limited bandwidth and require parallel drive currents for each diode in a normal configuration.

SUMMARY OF THE INVENTION

The object of the invention is to provide fast effective switching of the delay line segments.

The invention relates to the arrangement of the delay line switches from PIN diodes so as to require a constant direct current for each delay line with the current diverted by transistor switches through the switch diodes selected for turn on by external means while reverse biasing those switch diodes that are turned off. In the preferred embodiment the arrangement permits the variation of line length in incremental steps, the number of steps being equal to the Nth power of two where N is the number of binary delay line segments.

There are several advantages over prior practices. Intermodulation is decreased by reverse biasing of off diodes, power handling capabilities are extended by reduction in control power requirements. Switching time using PIN diode switches is extremely fast limited principally by the driving circuits. Switching transients are minimized by holding the total delay line drive current constant and using PIN diodes with similar voltage-current characteristics.

DETAILED DESCRIPTION

Figure 1:
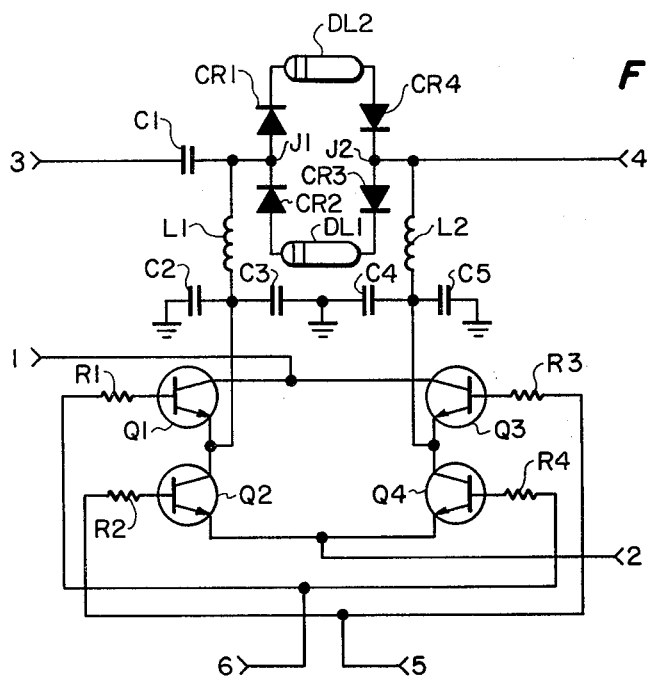
FIG. 1 is a schematic diagram of a basic delay line section.

A basic delay line section is shown in FIG. 1. It comprises two delay line segments DL1 and DL2, one of which is a short bypass line and the other of which is made of a longer length. The basic delay change for the section is the difference in delay of the line segments DL1 and DL2. Switching selection is provided by PIN diodes in series with the delay line segments. Diodes CR1 and CR4 are in series at opposite ends of line DL2 polarized in one direction between junction points J1 and J2, and diodes CR2 and CR3 are in series at opposite ends of line DL1 polarized in the other direction between the same junction points.

Switch control transistors Q1, Q2, Q3 and Q4 and connected in a bridge configuration. The collector electrodes of transistors Q1 and Q3 are connected together to bias current terminal 1, while the emitter electrodes of transistors Q2 and Q4 are connected together to bias current terminal 2. The emitter electrode of transistor Q1 and collector electrode of transistor Q2 are connected together and via choke L1 to the junction point J1; while the emitter electrode of transistor Q3 and collector electrode of transistor Q4 are connected together and via choke L2 to the junction point J2. Junction point J1 and an R.F. terminal 3 are coupled via capacitor C1, which blocks the flow of D.C. control current between successive delay line sections. Junction point J2 is directly connected to R.F. terminal 4. Chokes L1 and L2 block the flow of R.F. currents into the switch control transistors. Capacitors C2, C3, C4 and C5 provide R.F. bypass to ground for the switch control transistors. Control terminal 5 is coupled via resistors R2 and R3 to the base electrodes of transistors Q2 and Q3 respectively; while control terminal 6 is coupled via resistors R1 and R4 to the base electrodes of transistors Q1 and Q4 respectively. Resistors R1, R2, R3 and R4 limit base current flow as the switch control transistors are saturated by positive control voltages.

When minimum delay is required from the delay line section, transistors Q2 and Q3 are turned on by a positive voltage at terminal 5, causing direct current flow from terminal 1, through transistor Q3, choke L2, diode CR3, delay line segment DL1, diode CR2, choke L1, and transistor Q2 to terminal 2 turning on PIN diode switches CR2 and CR3. Transistors Q1 and Q4 are turned off by zero voltage at terminal 6. The direct current voltage drop across diode CR3, delay line segment DL1 and diode CR2 causes a reverse bias to be applied to turn off PIN diode switches CR1 and CR4. The R.F. currents then flow bilaterally between terminals 3 and 4 through capacitor C1, diode CR2, delay line segment DL1 and diode CR3. The PIN diodes are selected to give very low R.F. resistance when on and very high R.F. resistance with very low shunt capacity when reverse biased.

When maximum delay is required from the delay line section, transistors Q1 and Q4 are turned on by a positive voltage at terminal 6, and transistors Q2 and Q3 are turned off by zero voltage at terminal 5, causing direct current flow from terminal 1 through transistor Q1, choke L1, diode CR1, delay line segment DL2, diode CR4, choke L2 and transistor Q4 to terminal 2, turning on PIN diode switches CR1 and CR4. The direct current voltage drop across diode CR1, delay line segment DL2 and diode CR4 causes a reverse bias to be applied to turn off PIN diode switches CR2 and CR3. The R.F. currents then flow bilaterally between terminals 3 and 4 through capacitor C1, diode CR1, delay line segment DL2, and diode CR4.

Minimum delay (DL1+k) is produced by a positive voltage at terminal 5 and a zero voltage at terminal 6; while maximum delay (DL2+k) is produced by a positive voltage at terminal 6 and zero voltage at terminal 5. The differential delay obtainable is DL2 minus DL1.

Figure 2:
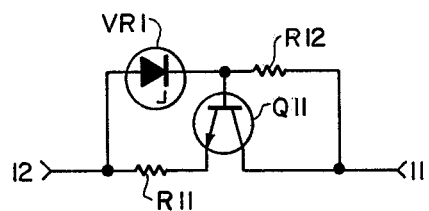
FIG. 2 is a schematic diagram of a constant current regulator.

One simple form of current regulator, which together with a D.C. source forms a constant current generator, is shown in FIG. 2. The series limiting transistor Q11 has its emitter electrode coupled via a resistor R11 to terminal 12, and its collector electrode directly connected to terminal 11. A Zener diode VR1 as a constant voltage device is connected is series with a resistor R12 between terminals 12 and 11, with the base electrode of transistor Q11 connected to the junction of the diode and resistor. The current generator is conventional and may be replaced by one of many integrated circuit current generators to improve temperature and supply source tolerance.

Figure 3:
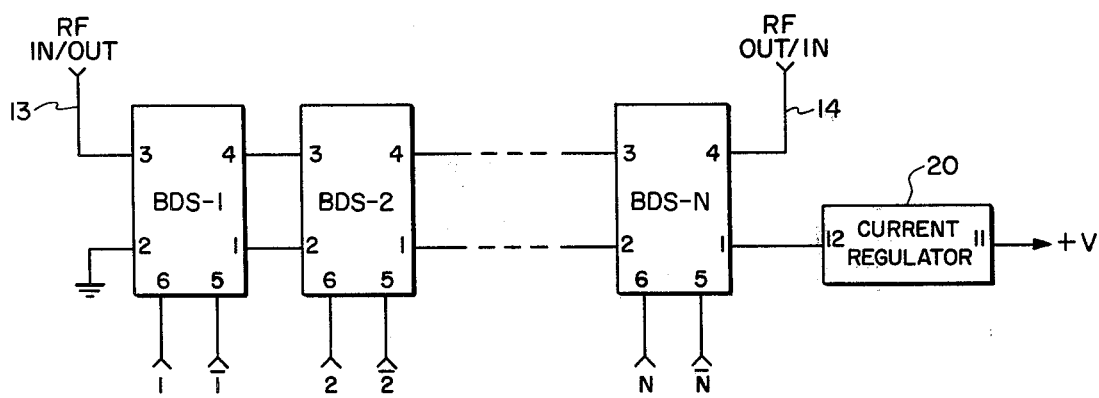
FIG. 3 is a block diagram of a binary switched RF time delay line comprised of "N" of the basic sections of FIG. 1 and the regulator of FIG. 2.

By cascading N basic delay line sections BDS-1 to BDS-N as shown in FIG. 3 and arranging the differential delay for each successive delay line section to be twice that of the preceeding section, a binary switched RF delay line is realized. Terminals 4 and 1 of each section are connected respectively to terminals 3 and 2 of the next section. Terminal 3 of the first section BDS-1 and terminal 4 of the Nth section BDS-N are connected to RF ports 13 and 14 respectively. The current regulator 20 may be that shown in FIG. 2, or any other suitable type. Its terminal 11 is connected to the direct current source +V, and terminal 12 is connected to terminal 1 of the Nth basic delay section BDS-N. Terminal 2 of section BDS-1 is connected to the ground return of the direct current source. Thus the same constant direct current flows through all of the sections in tandem. The terminals 5 and 6 of all of the sections BDS-1 to BDS-N are coupled to the output of a memory (not shown) which stores the binary value of the required delay, which is updated at regular intervals. Each section which is "on" for its maximum delay has terminal 6 at positive control voltage and terminal 5 at zero voltage, while each section which is "off" for its minimum delay has terminal 5 at the positive voltage and terminal 6 at zero voltage.

The delay line segments may be coax, stripline or microstrip. The switching diodes may be of a wide variety but for optimum performance should be PIN diodes selected for correct frequency range of operation, for RF power handling capacity, for control characteristics, and for mechanical configuration compatible with the RF delay line technology in use. The switch control transistors should have a high current gain to insure constant current through the total line and may be configured from high beta transistors, Darlington arranged transistors pairs or field effect transistors. The constant current source may be configured from a single transistor, resistors, and voltage reference diode or from a more complex integrated circuit.

A typical Steerable Antenna Null Combiner System is shown in U.S. Pat. No. 3,964,065. The binary switched delay line disclosed herein may be used for the phase shifters shown in the patent, with the D/A converters omitted for the control voltages from the memories.

Figure 4:
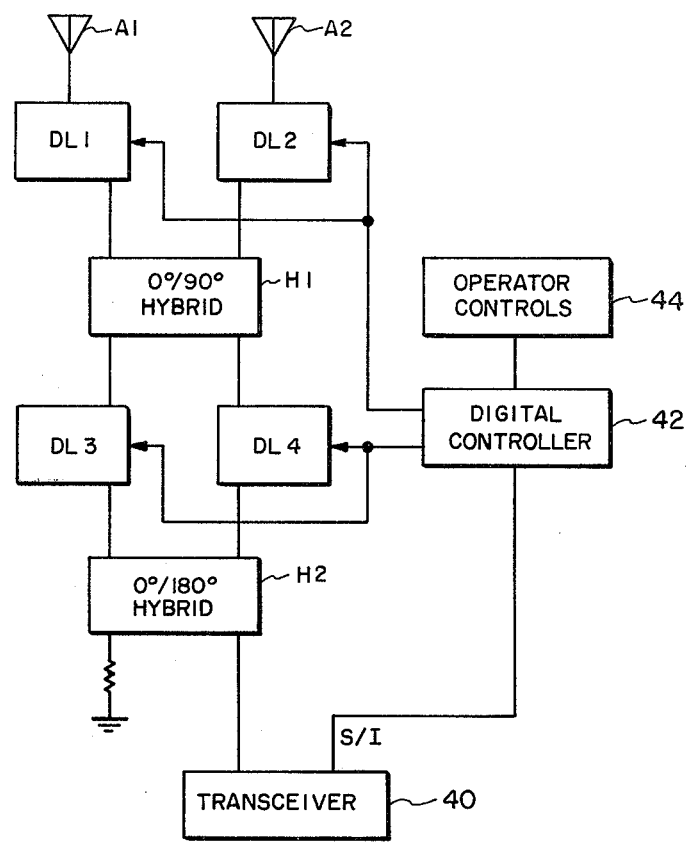
FIG. 4 is a block diagram of a steerable null antenna system.

The block diagram of FIG. 4 shows another Steerable Null Antenna System, which is used for both receive and transmit operation. Two antennas A1 and A2 work with a transceiver 40. The relative phase of the two antenna signals is controlled by two variable delay lines DL1 and DL2. The relative amplitude is controlled by a variable ratio combiner comprising a quadrature hybrid H1, two variable delay lines DL3 and DL4, and a sum-difference hybrid H2. The four variable delay lines may each be of the type shown in FIG. 3. The setting of the delay lines is controlled by a digital controller 42, which may be generally similar to that described in U.S. Pat. No. 3,964,065. Manual operation makes use of operator controls 44. Automatic operation depends on a signal-to-interference ratio signal derived in the transceiver 40. Each of the delay lines would typically comprise seven or eight sections.

What is claimed is:

1. A delay unit for providing an incrementally variable delay for radio frequency signals, comprising:

a plurality of delay line sections connected in tandem for said radio frequency signals and also for direct current bias;

wherein each delay line section comprises first and second delay line segments in parallel between first and second junction points, each of said delay line segments having diode means in series with it between said junction points polarized in opposite directions, the first delay line segment being relatively short and the second delay line segment being of a length to provide a given differential delay assigned to that section, switch control means comprising four switch devices connected in a bridge configuration, first and second terminals for bias current connected to diagonally opposite points of the bridge configuration, with the other diagonal having its end points connected via first and second inductors respectively to said first and second junction points, third and fourth terminals coupled respectively to said first and second junction points with at least one blocking capacitor, fifth and sixth terminals for control signals, each of said four switch devices having a control terminal, the fifth terminal being connected to the control terminals of diagonally opposite ones of said switch devices and the sixth terminal being connected to the control terminals of the other two switch devices;

each said section being operative to provide minimum delay responsive to an "on" control signal at the fifth terminal to turn on the switch devices coupled thereto and to an "off" signal at the sixth terminal to turn off the switch devices connected thereto so that bias current between the first and second terminals flows through the switch devices turned on and the first delay line segment to forward bias the diode means in series therewith, which causes the diode means in series with the second delay line segment to be reverse biased, so that radio frequency signals may flow between the third and fourth terminals through the first delay line segment; and being operative to provide maximum delay responsive to an "on" control signal at the sixth terminal and an "off" control signal at the fifth terminal so that the switch devices are in the states to cause the bias current between the first and second terminal to flow through the second delay line segment to forward bias the diode means in series therewith and to reverse bias the diode means in series with the first delay line segment, so that the radio frequency signals flow through the second delay line means; the delay unit having each delay line section except the last connected with said first and fourth terminals connected respectively to said second and third terminals of the next section, with a direct-current constant current source connected to the second terminal of the first section and the first terminal of the last section, and with said third terminal of the first section and said fourth terminal of the last section connected to place the delay unit in a radio frequency signal path for flow of radio frequency signals in either direction.

2. A delay unit according to claim 1, wherein said diode means comprises two PIN diodes at opposite ends of the first delay line segment and another two PIN diodes at opposite ends of the second delay line segment.

3. A delay unit according to claim 2, wherein said switch devices are first, second, third and fourth transistors, each having emitter, base and collector electrodes, said control terminals being the base electrodes with respective limiting resistors, the first and third transistors having the collector electrodes connected together to said first terminal, the second and fourth transistors having the emitter electrodes connected together to said second terminal, the emitter electrode of the first transistor and collector electrode of second transistor being connected together to said first inductor and also via capacitive means to a ground point, and the emitter electrode of the third transistor and the collector electrode of the fourth transistor being connected together to said second inductor and also via capacitive means to a ground point.

4. A delay unit according to claims 1, 2 or 3 wherein the differential delay of one delay line section provides a minimum incremental step, another section has a differential delay equal to twice said incremental step, another has a differential delay equal to four times the incremental step, and the others increasing in similar binary relation.

* * * * *